(12) United States Patent
Konstad

(10) Patent No.: US 6,407,916 B1
(45) Date of Patent: Jun. 18, 2002

(54) COMPUTER ASSEMBLY FOR COOLING HIGH POWERED MICROPROCESSORS

(75) Inventor: Rolf A. Konstad, Gold River, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/592,117

(22) Filed: Jun. 12, 2000

(51) Int. Cl.$^7$ .................................................. H05K 7/20
(52) U.S. Cl. ................. 361/687; 62/259.2; 165/104.33; 361/695; 361/700; 454/184
(58) Field of Search .................... 165/104.33; 174/15.2; 62/259.2; 361/700–704, 707, 709–710, 687–688, 690, 694–696; 454/184

(56) References Cited

U.S. PATENT DOCUMENTS

| | | | |
|---|---|---|---|
| 4,825,337 A | * 4/1989 | Karpman | 361/704 |
| 5,339,214 A | 8/1994 | Nelson | |
| 5,473,506 A | * 12/1995 | Kikinis | 361/688 |
| 5,513,070 A | 4/1996 | Xie et al. | |
| 6,196,003 B1 | * 3/2001 | Macias et al. | 361/687 |

* cited by examiner

Primary Examiner—Gregory Thompson
(74) Attorney, Agent, or Firm—Mark Seeley

(57) ABSTRACT

An improved computer assembly is disclosed, which includes a chassis that has at least one drive bay, the drive bay having an opening. A heat sink is positioned within the drive bay and a thermally conductive component is coupled to the heat sink and to a processor assembly. In a preferred embodiment, a heat pipe couples the thermally conductive component to the heat sink.

14 Claims, 2 Drawing Sheets

COMPUTER ASSEMBLY FOR COOLING HIGH POWERED MICROPROCESSORS

FIELD OF THE INVENTION

The present invention relates to an apparatus for cooling components within a computer system enclosure. More specifically, the invention relates to a computer assembly for cooling high powered microprocessors by positioning a heat sink in a drive bay.

BACKGROUND OF THE INVENTION

As microprocessors are designed to operate at progressively higher frequencies, power, and power density, they present a formidable challenge to those struggling to devise practical ways to dissipate the heat that such devices generate. The conventional method for removing heat is to place a heat sink next to the microprocessor. As cooling requirements increase, however, undesirably large and heavy heat sinks must be used—especially when the chassis (which houses these components) provides a warm, low airflow environment. Such heat sinks may require significant motherboard real estate for attachment—in the critical area near the processor socket, and require use of motherboard bracing elements to support the extra weight.

Proposed designs that enable use of smaller heat sinks are described in U.S. Pat. No. 6,064,571, and in Ser. No. 09/015,423, filed Jan. 29, 1998, each assigned to this application's assignee. In those systems, a fan draws air from outside the chassis, then funnels it directly onto a heat sink, which is mounted over a microprocessor. This generates increased convection near the heat sink, which enables a relatively small heat sink to dissipate a significant amount of heat. Although such designs could potentially help solve the thermal problem, widespread adoption of them would require significant modification to standard system designs. For example, such fan/duct assemblies would require the microprocessor to be mounted to a particular location on the motherboard, and would require the chassis to position various mounting features and vents at precise locations relative to the motherboard. Needless to say, coordinating such a form factor transition could prove to be a costly endeavor.

Accordingly, there is a need for an improved apparatus for cooling high powered microprocessors. There is a need for such an apparatus that enables such cooling without requiring relatively bulky and heavy heat sinks to be positioned next to those high powered devices. There is also a need for such an apparatus that can be integrated into standard system designs without significant modification of those designs. The computer assembly of the present invention provides such an apparatus.

DETAILED DESCRIPTION OF THE PRESENT INVENTION

A computer assembly is described. That assembly includes a heat sink positioned within a drive bay. That heat sink is coupled to a thermally conductive component, which in turn is coupled to a microprocessor (hereinafter referred to as a "processor"). In a preferred embodiment, the heat sink is coupled to the thermally conductive component with a heat pipe. In the following description, numerous specific details are set forth such as material types, dimensions, etc., to provide a thorough understanding of the present invention. However, it will be apparent to those skilled in the art that the invention may be practiced in many ways other than those expressly described here. The invention is thus not limited by the specific details disclosed below.

Figure 1:
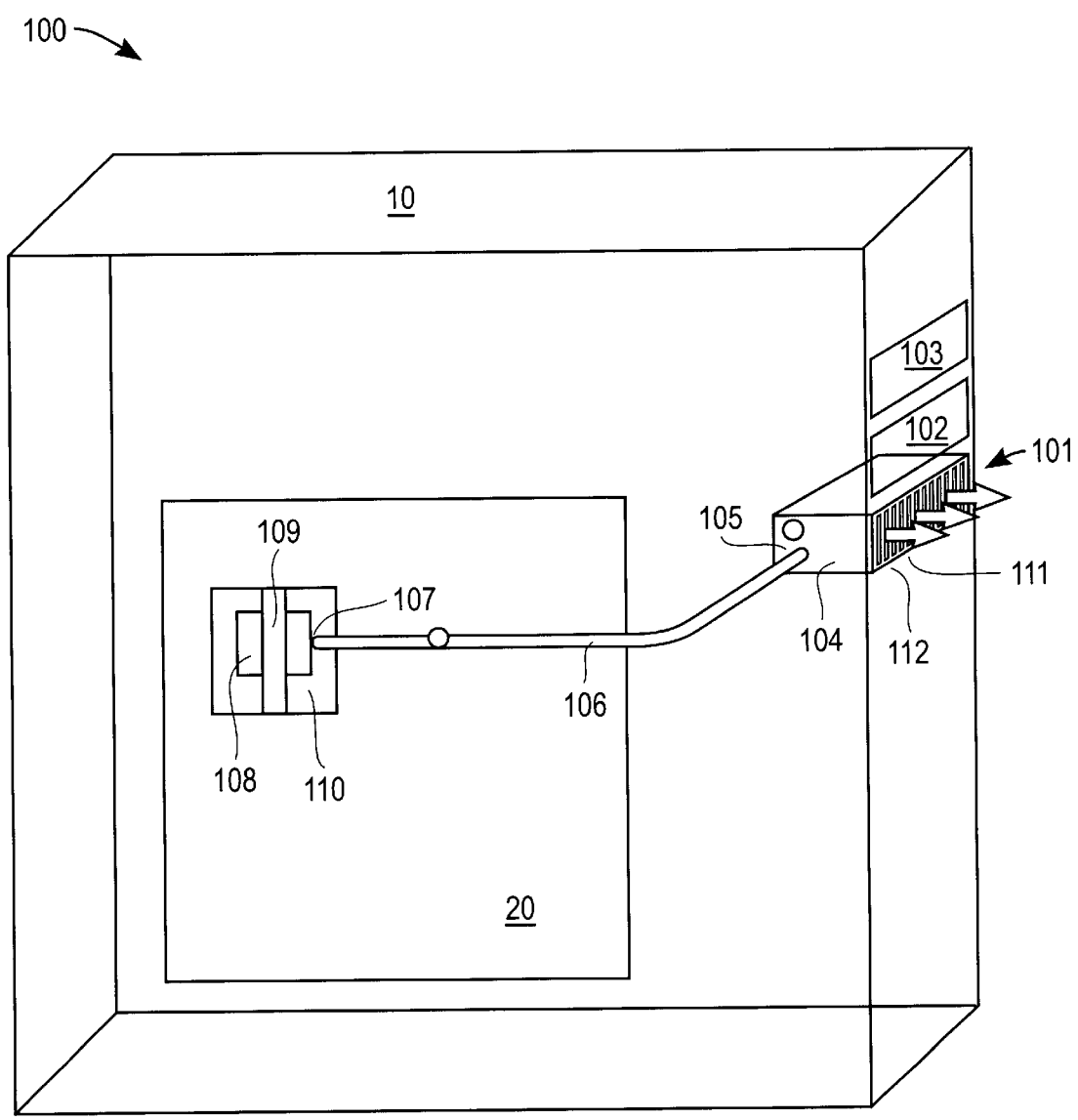
FIG. 1 is a perspective view of an embodiment of the computer assembly of the present invention.

As shown in FIG. 1, computer assembly 100 comprises chassis 10 and motherboard 20. Formed within chassis 10 are drive bays 101, 102 and 103. Positioned within drive bay 101 is heat sink 104. Heat sink 104 is coupled to first end 105 of heat pipe 106. Heat pipe 106 is coupled at second end 107 to thermally conductive component 108. Thermally conductive component 108 is, in turn, coupled to a processor that is located beneath it. (That processor is not visible in the drawing as it is obscured by thermally conductive component 108, which is positioned above it.)

In this embodiment, clip 109 is coupled to socket 110. Clip 109 is positioned across heat pipe 106 to couple it to thermally conductive component 108. In this way, clip 109 holds heat pipe 106 and component 108 in place above the processor, after the processor has been inserted into socket 110. By coupling heat pipe 106 and component 108 to the processor/socket assembly with a simple clip, motherboard real estate (which would otherwise have been required to accommodate the support structures that must accompany a heavy/bulky heat sink) need not be used to secure heat pipe 106.

The assembly shown in FIG. 1, enables heat, which the processor generates, to be transferred from the processor to heat sink 104. By positioning heat sink 104 in drive bay 101, such a design enables heat to be removed from a high powered processor without requiring placement of a relatively heavy heat sink next to the processor.

Drive bays 101, 102 and 103 may comprise standard enclosures that conventional chassis use to receive various types of disks (and the drives that operate on them), e.g., floppy disk, CD-ROM, CD-RW, or DVD. In a particularly preferred embodiment, drive bay 101 is a standard 5.25 inch drive bay. As shown in FIG. 1, heat sink 104 fits within drive bay 101 such that it extends across substantially all of drive bay opening 111, in both the horizontal and vertical directions. Positioning heat sink 104 at front end 112 of drive bay 101 exposes heat sink 104 to ambient conditions, enabling fresh, relatively cool, outside air to transfer heat away from heat sink 104.

Heat sink 104 may be made from materials conventionally used to make such components for use in computer assemblies. Heat sink 104 may be shaped to increase the surface area that is exposed to the environment, or to air that is forced across it. Heat sink 104 may, for example, be made from an anodized aluminum material and may contain a plurality of fins to increase its surface area.

Heat pipe 106 may be coupled to heat sink 104 at first end 105 in a conventional manner. At second end 107, heat pipe 106 is coupled to thermally conductive component 108. Heat pipe 106 serves to transfer heat from component 108 (which absorbs heat that the underlying processor dissipates) to heat sink 104. In one embodiment, heat pipe 106 may contain a fluid (e.g., water) that flows along a wick (not shown), which is attached to the pipe's inner surface. In such a device, heat transferred to heat pipe 106 from the processor (via component 108) evaporates that fluid at an evaporation portion of heat pipe 106. The resulting pressure differential between second end 107 and first end 105 of heat pipe 106 will cause that vaporized fluid to flow to end 105, where it is condensed at a condensation portion of heat pipe 106. That condensed fluid then flows back to end 107, where it is again evaporated—completing the cycle. In a preferred embodiment, heat pipe 106 is made from a flexible copper tube, which is preferably less than about 0.5 inches in diameter and less than about 10 inches long. Although preferably made from copper, heat pipe 106 may be made from other materials that provide the desired flexibility and heat transfer properties.

Thermally conductive component 108 may comprise an aluminum block, which is positioned in thermal contact with a processor that has been previously inserted into socket 110. (Socket 110 may comprise a conventional socket of a type typically used to couple a processor to motherboard 20.) A thermal grease can be deposited between the processor and component 108 to reduce thermal resistance between those components.

The particular shape of component 108 is not critical as long as it may serve to transfer heat from the processor to heat pipe 106. Instead of aluminum, carbon based materials, copper, or other thermally conductive materials may be used to form component 108. Thermally conductive component 108 may include a recessed portion for receiving end 107 of heat pipe 106, providing a larger surface area for contact between those components. Heat pipe 106 may be attached to component 108 in any conventional manner, examples of which are described in U.S. Pat. Nos. 5,339,214 and 5,513,070, each assigned to this application's assignee.

Figure 2:
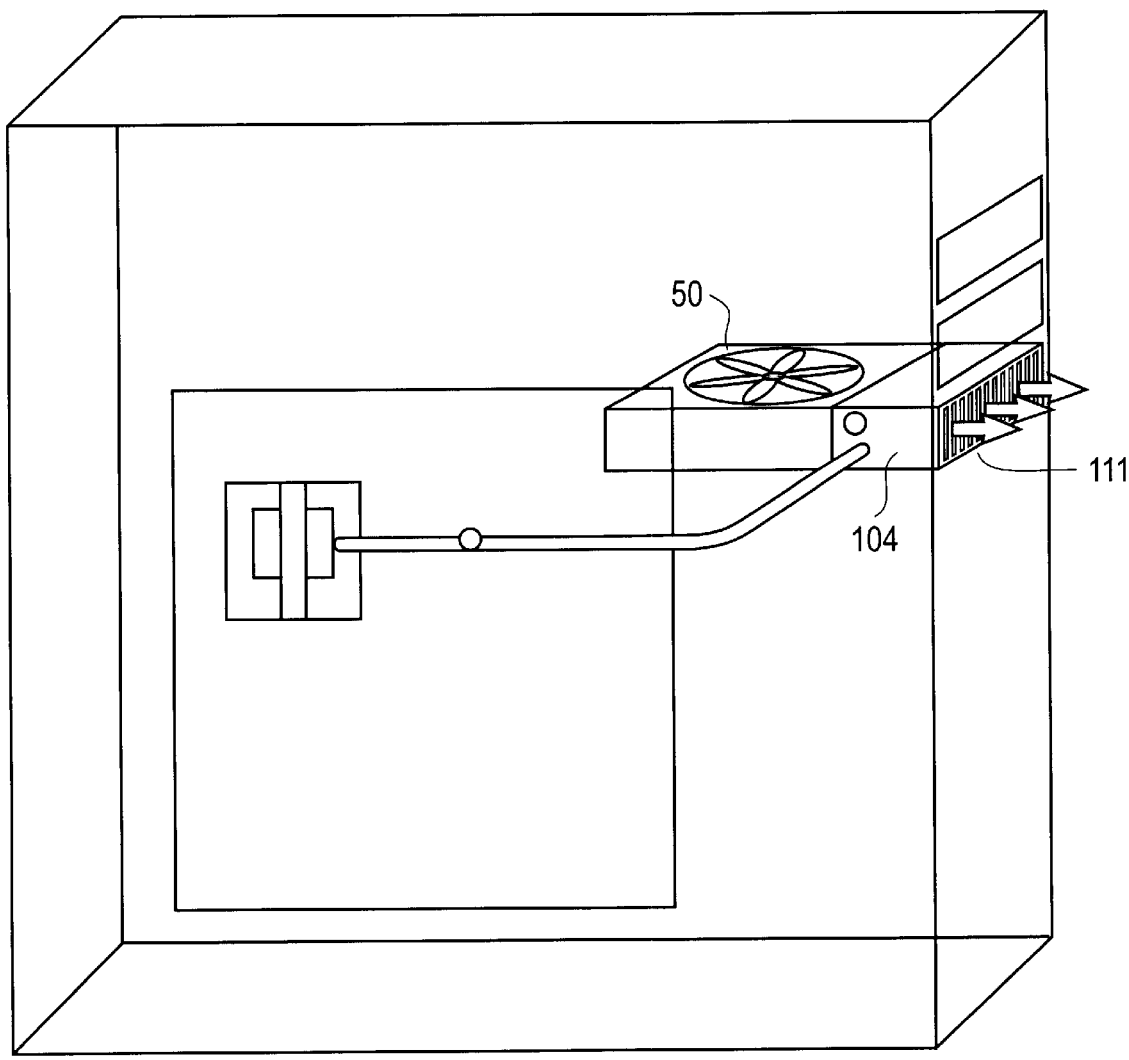
FIG. 2 is a perspective view of a second embodiment of the computer assembly of the present invention.

FIG. 2 illustrates a second embodiment of the present invention in which fan 50 is positioned next to heat sink 104 to enhance heat transfer. In a preferred embodiment, both fan 50 and heat sink 104 are designed to fit into a standard chassis drive bay—e.g., a conventional 5.25 inch drive bay, and fan 50 abuts heat sink 104. Fan 50 may be a standard 40 mm or 60 mm fan, like those conventionally used for system cooling. Power can be provided to fan 50 in various ways, e.g., via a disk drive power connector. In this embodiment, fan 50 preferably is oriented within drive bay 101 such that it forces air from within chassis 10, across heat sink 104, and out drive bay opening 111. In addition, fan 50 preferably is oriented with respect to heat sink 104 such that it forces air to readily flow through heat sink 104 in a manner that maximizes the surface area of heat sink 104 that is exposed to that air flow. Although the arrows included in FIGS. 1 and 2 indicate that air is forced (or convected) out the front of the chassis, alternative designs could exhaust air into the chassis, or out the back of the chassis.

An improved computer assembly for cooling high powered microprocessors has been described. By locating the heat sink in an existing drive bay (enabling heat to be vented from the system at that location), this apparatus can be easily integrated into standard chassis designs, enabling such designs to accommodate higher power processors. Because it dispenses with the need for placing bulky/heavy heat sinks (and their associated retention mechanisms) near the processor socket, systems that practice the present invention can be designed without requiring the designer to make difficult signal routing decisions.

Features shown in the above referenced drawings are not intended to be drawn to scale, nor are they intended to be shown in precise positional relationship. Additional components that may be included in the illustrated computer assembly have been omitted as they are not useful to describe aspects of the present invention.

Although the foregoing description has specified a computer assembly that includes certain features, those skilled in the art will appreciate that many modifications and substitutions may be made. For example, although the embodiments described above do not show a processor that includes a heat sink positioned next to it, the above described computer assembly may include such a heat sink. When included, the dimensions and weight of such a heat sink could, of course, be substantially reduced from those that would have been required in computer assemblies that do not embody the present invention. In addition, although a preferred embodiment of the present invention employs a heat pipe to transfer heat from the processor to the heat sink, those skilled in the art will appreciate that other thermal transport mechanisms may be used instead, e.g., a liquid cooling loop. For that reason, the invention is not limited to the use of any particular device to perform that thermal transport function. Rather, it is intended that all such modifications, alterations, substitutions and additions be considered to fall within the spirit and scope of the invention as defined by the appended claims.

What is claimed is:

1. A computer assembly comprising:
   a chassis having at least one drive bay, the drive bay having an opening;
   a heat sink positioned within the drive bay;
   a motherboard enclosed within the chassis;
   a socket for coupling a processor to the motherboard;
   a thermally conductive component for coupling to the heat sink and to a processor; and
   a heat pipe that couples the thermally conductive component to the heat sink.

2. The assembly of claim 1 further comprising a fan positioned next to the heat sink.

3. The assembly of claim 2 wherein the fan is oriented to force air from within the chassis, across the heat sink, and out the drive bay opening.

4. The assembly of claim 3 wherein a clip is positioned across the heat pipe; the clip coupling the heat pipe to the thermally conductive component.

5. The assembly of claim 4 wherein the drive bay is a standard 5.25 inch drive bay.

6. The assembly of claim 5 wherein the heat sink extends across substantially all of the drive bay opening.

7. A computer assembly comprising:
   a chassis having at least one drive bay, the drive bay having an opening;
   a heat sink positioned within the drive bay at the drive bay opening, the heat sink being exposed to the ambient environment;
   a motherboard enclosed within the chassis;
   a socket for coupling a processor to the motherboard; and
   a heat pipe coupled at one end to the heat sink and at the other end to a thermally conductive component;
   wherein the thermally conductive component is coupled to a processor that has been inserted into the socket.

8. The assembly of claim 7 wherein the heat pipe contains a fluid, and includes a condensation portion and an evaporation portion.

9. The assembly of claim 8 wherein the drive bay is a standard 5.25 inch drive bay.

10. The assembly of claim 9 wherein the heat sink extends across substantially all of the drive bay opening and comprises a plurality of fins for increasing the heat sink's surface area.

11. A computer assembly comprising:
    a chassis having at least one drive bay, the drive bay having an opening;
    a heat sink positioned within the drive bay at the drive bay opening;

a fan positioned next to the heat sink, the heat sink positioned between the fan and the drive bay opening;

a motherboard enclosed within the chassis;

a socket for coupling a processor to the motherboard; and a thermally conductive component coupled to the heat sink and to a processor that has been inserted into the socket.

12. The assembly of claim 11 wherein the fan is positioned within the drive bay enclosure.

13. The assembly of claim 12 wherein the heat sink extends across substantially all of the drive bay opening and comprises a plurality of fins for increasing the heat sink's surface area, and wherein the fan is oriented with respect to the heat sink to enable air to readily flow through the heat sink.

14. The assembly of claim 13 wherein the drive bay is a standard 5.25 inch drive bay.

\* \* \* \* \*